(12) United States Patent
Caletka et al.

(10) Patent No.: US 6,649,833 B1
(45) Date of Patent: Nov. 18, 2003

(54) NEGATIVE VOLUME EXPANSION LEAD-FREE ELECTRICAL CONNECTION

(75) Inventors: David V. Caletka, Apalachin, NY (US); Krishna Darbha, Kirkland, WA (US); Donald W. Henderson, Ithaca, NY (US); Lawrence P. Lehman, Endicott, NY (US); George H. Thiel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/215,451

(22) Filed: Aug. 9, 2002

(51) Int. Cl.[7] ............................. H05L 23/28; H05K 5/06
(52) U.S. Cl. .................. 174/52.2; 257/738; 228/180.22
(58) Field of Search ......................... 174/52.2, 52.4; 257/738, 693; 228/180.22

(56) References Cited

U.S. PATENT DOCUMENTS

| | | | |
|---|---|---|---|
| 5,478,778 A | 12/1995 | Tanisawa | 437/183 |
| 5,735,452 A | 4/1998 | Yu et al. | 228/254 |
| 5,895,976 A * | 4/1999 | Morrell et al. | 257/778 |
| 6,086,687 A | 7/2000 | Oud et al. | 148/400 |
| 6,139,979 A | 10/2000 | Takaoka et al. | 428/646 |
| 6,189,208 B1 | 2/2001 | Estes et al. | 29/840 |
| 6,198,207 B1 | 3/2001 | Lally et al. | 310/348 |
| 6,204,490 B1 | 3/2001 | Soga et al. | 219/678 |
| 2002/0046856 A1 * | 4/2002 | Alcoe | 174/52.1 |

* cited by examiner

Primary Examiner—Hung V. Ngo
(74) Attorney, Agent, or Firm—Scully, Scott, Murphy & Presser; Arthur J. Samodovitz, Esq.

(57) ABSTRACT

An electronic package is provided including a substrate, a device mounted on the substrate, and a solder member electrically coupling the device to the substrate. The package includes a dielectric material positioned substantially around the solder member which forms a physical connection between the substrate and the device. The volume of the solder member contracts during melting thereof to prevent failure of the physical connection and/or the electrical coupling between the substrate and the device.

20 Claims, 1 Drawing Sheet

NEGATIVE VOLUME EXPANSION LEAD-FREE ELECTRICAL CONNECTION

FIELD OF THE INVENTION

The present invention relates to an electrical connection between conductors, more particularly to the electrical connection which is comprised of a material which has a negative volume expansion, upon melting and which is lead-free.

BACKGROUND OF THE INVENTION

Solders have been conventionally used for achieving electrical and mechanical joints between electronic devices and electronic parts. Solders containing tin and lead as major components have been generally used for this purpose. In addition, solders not containing lead, so called "lead-free solders", which typically contain tin as a major component and other metals such as silver and copper are being used in consideration of environmental concerns. In recent years, soldered electronic assemblies with electrical joints having satisfactory soldering characteristics have been produced using such lead-free solders. For example, U.S. Pat. No. 5,730,932, issued on Mar. 24, 1998 and assigned to the IBM Corporation describes a lead-free solder alloy and microelectronics circuits soldered by the alloy. Another example, U.S. Pat. No. 6,204,490 issued on Mar. 20, 2001 and assigned to Hitachi, Ltd., describes a method of manufacturing an electronic circuit card on which components are mounted using a lead-free solder.

Flip chip mounting is an increasingly popular technique for electrically connecting an electronic device, such as an semiconductor chip, to a substrate, such as a circuit board or a chip carrier. In a flip chip configuration, the active circuitry face of the chip is mounted face down or "flipped" onto the substrate. Conductive contact pads on the flip chip are aligned with corresponding conductive contact pads on the substrate, with the flip chip and substrate contact pads electrically connected by way of an electrically conductive material. The flip chip mounting technique eliminates the use of bond wires between a semiconductor chip and substrate, resulting in improved electrical performance.

A wide range of electrically conducting materials have been used for making the electrical connection between conductive contact pads of the flip chip and substrate, the most common of which being solder in the form of bumps. Other materials that have been used to make this connection are gold bumps, gold stud bumps, and electrically conducting polymer compositions.

Once a flip chip is bonded to a substrate, an underfill material is usually dispensed between the flip chip and the substrate. The underfill is typically provided as a liquid adhesive resin and can be dried, cured and/or polymerized. The underfill material provides enhanced mechanical adhesion and mechanical stability between the substrate and the flip chip and inhibits environmental attack of the flip chip and substrate surfaces.

One type of flip chip bonding utilizes what is known as C4 connections (controlled-collapse chip connections) to electrically connect the substrate and the flip chip. C4 interconnections can be arranged in an area array rather than a peripheral array on the face of the flip chip. C4 connections are very small solder bumps formed on the flip chip conductive pads during the processing steps required to manufacture the flip chip module assembly. When the flip chip is placed on the substrate, the solder bumps are aligned with conductive contact pads on the substrate surface substantially arranged in a pattern identical to that of the solder bumps. During a reflow process, the solder bumps melt and wet the conductive pads. The surface tension of the liquid solder helps align the flip chip properly on the substrate. Once the solder is cooled and solidifies, the flip chip is electrically, mechanically, and thermally connected to the substrate. At this point, an underfill material can be dispensed to encapsulate the electrical connections and substantially fill the space between the flip chip and the substrate. The underfill material is then cured to form a flip chip module. During subsequent assembly of the underfilled module to a circuit board or other carrier and during rework, the module can be heated to temperatures that may cause the electrical connections to undergo reflow (to melt). Each reflow operation places stresses on the module, that can have a tendency to cause delamination in the module. Specifically, such delamination refers to delamination at or near the underfill to flip chip interface and/or delamination at or near the underfill to substrate interface. There are three sources of stress manifested during reflow processing which may lead to delamination in the module. These sources of stress are:

1. Coefficient of thermal expansion differences between the materials comprising the layered structure of the module including the flip chip, underfill, solder, and substrate.
2. Steam pressurization of any poorly bonded/adhered underfill interfaces (i.e., partially delaminated interfaces) in this layered region due to vaporization of latent moisture in the module.
3. The melting of the encapsulated solder electrical connection, and the solder volume increase associated with the melting process.

In modules having uniformly good adhesion of the underfill with the flip chip and substrate interfaces, the largest source of stress in the module is the melting of the solder electrical connection and specifically the solder volume increase associated with this melting process. Melting of most commonly used solders results in a volume increase of about 2 to about 4 percent. The volume increase of the solder electrical connection of C4 modules encapsulated by underfill occurs at the solder melting point and, subjects the layered flip chip-underfill-substrate module to large stresses. The molten solder is placed under a large hydrostatic stress by the constraining underfill. Immediately beneath the C4 connections, the stresses are compressive at the flip chip and substrate C4 connection pad interfaces. In the regions immediately adjacent to the C4 connections, the underfill interfaces at the flip chip and substrate are subjected to large delaminating tensile stresses because the molten solder is undergoing an expansion, tending to push the flip chip upwards away from the underfill, while the underfill is expanding at a lesser rate. If the adhesion in these regions is insufficient to withstand the resulting large tensile stresses, delamination results.

The present invention is directed at overcoming the problem associated with the stresses that occur from the solder volume increase associated with the melting process as set forth above. It is desirable to have an electronic package that substantially eliminates this stress. Electronic packages of this type will have lower defect levels and increased operational field life.

OBJECTS AND SUMMARY OF THE INVENTION

Accordingly it is the object of this invention to enhance the art of packaging technology.

It is another object of this invention to provide an electrical connection comprising a volume of solder between two conductors that is contractible during melting of the solder.

It is yet another object of this invention to provide an electronic package that provides an improved electrical coupling between a device and a substrate.

Still yet another object of this invention is to provide an electronic package that will be manufactured with relatively lower costs than many current products.

Still yet another object of this invention is to provide an electronic package having at least one solder member electrically coupling a device to a substrate and a dielectric material forming a physical connection between the device and substrate, the volume of the solder member contracting during melting thereof, thereby improving operational field life by preventing failure of the physical connection and/or the electrical connection between the substrate and the device.

According to one aspect of the invention, there is provided an electrical connection comprising a first conductor, a second conductor, and a volume of solder used to form the electrical connection between the first conductor and the second conductor wherein the volume of solder is contractible during melting thereof.

According to another aspect of the invention, there is provided an electronic package comprising a substrate, a device mounted on the substrate, at least one solder member electrically coupling the device to the substrate, and a dielectric material positioned substantially around the solder member and forming a physical connection between the substrate and the device, the volume of the solder member contracting during melting of the solder.

According to yet another aspect of the invention, there is provided an electronic package comprising a substrate, a device mounted on the substrate, at least one solder member electrically coupling the device to the substrate, and a dielectric material positioned substantially around the solder member and forming a physical connection between the substrate and the device, the volume of the solder member contracting during melting thereof to prevent failure of the physical connection or the electrical coupling between the substrate and the device.

The above objects, advantages, and features of the present invention will become more readily apparent from the following detailed description of the presently preferred embodiments as illustrated in the accompanying drawings.

BEST MODE FOR CARRYING OUT THE INVENTION

Figure 1:
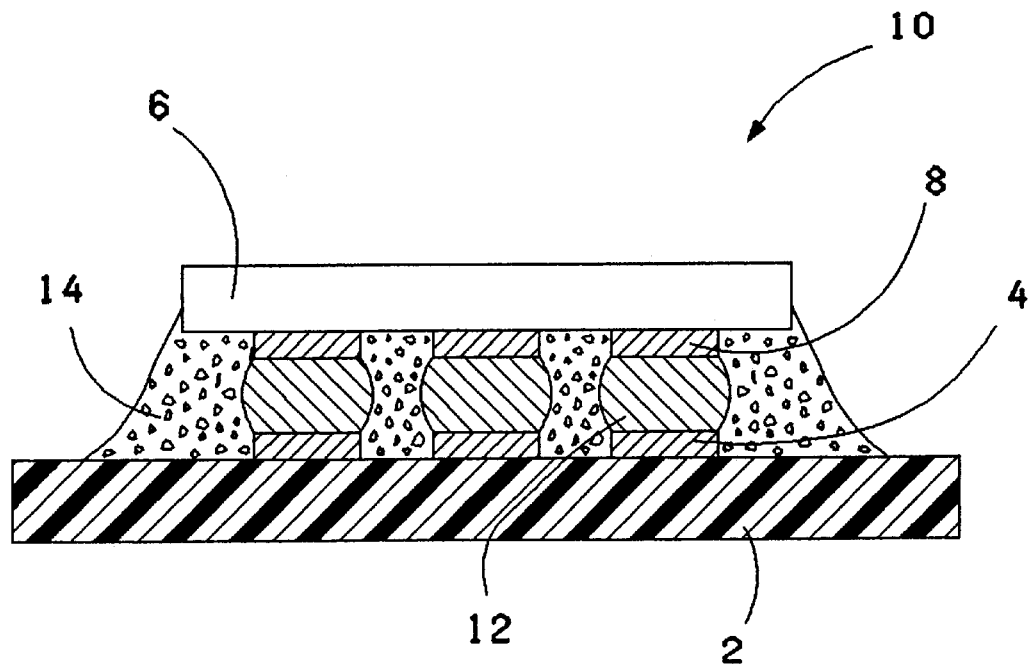
FIG. 1 is an enlarged sectional view in elevation of one embodiment of the electronic package of the present invention illustrating a semiconductor device electrically coupled to a substrate by a plurality of solder members.

Referring to the drawings, FIG. 1 shows a much enlarged sectional view in elevation of the electronic package 10 of the present invention. Electronic package 10 includes a substrate 2 having a first conductor 4 positioned thereon, a device 6 mounted on the substrate, a second conductor 8 positioned on a surface of the device, and a volume of solder comprising a solder member 12 which forms an electrical connection between the first conductor and the second conductor. Solder member 12 can be one of a plurality of solder members. For example, the number of solder members can range from a few hundred to over one thousand. A substantially cured dielectric material 14 is positioned substantially around solder member 12 and between first and second conductors, 4 and 8, respectively. Dielectric material 14 forms a physical connection between substrate 2 and device 6. The dielectric material 14 can be an organic encapsulating material, such as an epoxy or a cyanate ester and can include an inorganic filler material. Examples of filler material that can be used in this invention are silica and alumina. Some commercially available organic encapsulating materials that can be used in this invention are available from Loctite Corporation, Wappingers Falls, N.Y. under the product names FP 4511 and FP 4549. Other examples of organic encapsulating materials that can be used in this invention are the products JM8806 and U8437-2, available from Ablestik Electronic Materials and Adhesives, Rancho Dominguez, Calif. and Namics Corporation, Niigata City Japan, respectively.

Substrate 2 can be a printed wiring board, or a chip carrier (typically much smaller than a normal sized board) comprising a material selected from the group consisting of ceramics, epoxy resins, filled epoxy resins, liquid crystal polymers, thermoplastics, filled thermoplastics, polyimides, and polyesters. First conductor 4 can be a metal, for example, gold, copper, or aluminum or a conductive polymer composition, or combinations thereof. A layer of conventional solder paste (not shown) can be positioned on first conductor 4.

Device 6 may comprise a semiconductor chip, an opto-electronics assembly, a chip carrier, or a like structure. If the device is a chip, preferably the chip is positioned face down or in the flipped (flip chip) position as shown. The chip's second conductor 8 can be a metal such as aluminum or copper or alloys thereof and may have surface finishes, such as nickel, nickel-aluminum, and/or palladium.

Solder member 12 comprises a metal alloy including a metal selected from the group consisting of bismuth, antimony, and gallium. Metals antimony, gallium, and bismuth are contractible during melting; that is, these undergo volume contraction or negative volume expansion on melting and tend to induce volume contraction on melting in alloys of which these may form a component of. One metal which may be used as the other part of said alloy is tin. For example, in tin-bismuth solder alloys having a bismuth composition of from about 40% by weight to about 98% by weight of the alloy, the alloy undergoes volume contraction upon melting. This property of these metals and alloys is important when these metals/alloys are utilized as soldering alloys for solder member 12. Further advantages of electronic package 10 will be explained in greater detail below.

Figure 2:
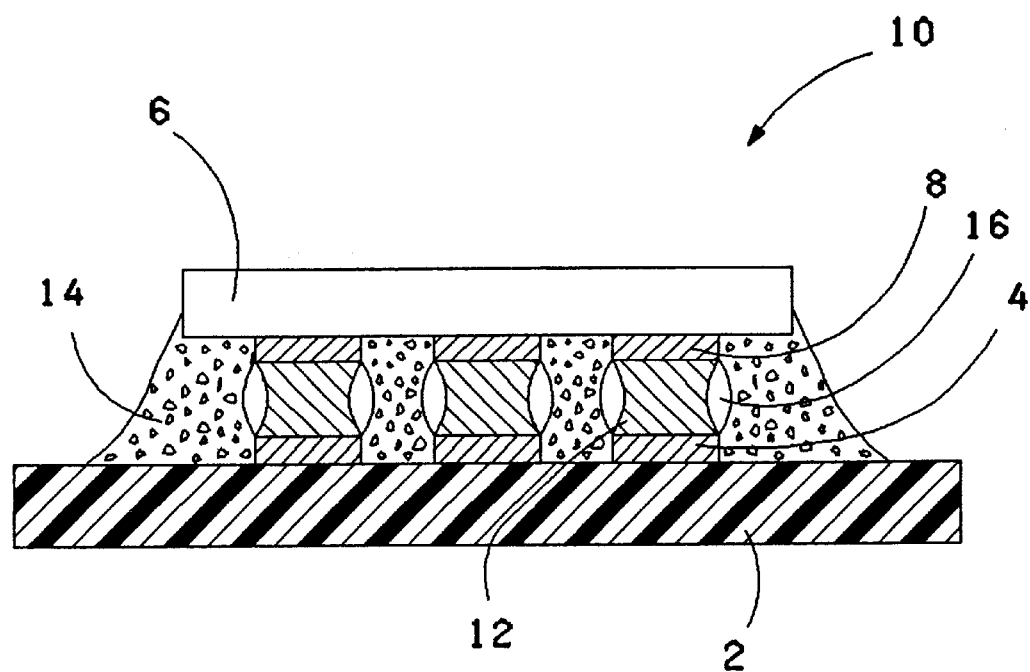
FIG. 2 is a view of the electronic package of FIG. 1 after heating the electronic package to a temperature above the melting point of the solder members.

FIG. 2 illustrates electronic package 10 of FIG. 1 upon melting of solder member 12. Solder member 12 contracts about 3% or less during melting and creates a void 16 between substantially cured dielectric material 14 and the solder member. Dielectric material 14 completely surrounds solder member 12 during contraction. Portions of the dielectric material may engage the solder member during such contraction. As previously described, upon melting most solders, those not having volume contraction properties, undergo a significant volume increase. Use of solder members having a composition as described above, completely eliminates the major source of delaminating stress caused by solder volume increase during melting (solder assembly reflow or rework reflow processes) preventing failure of the physical connection between semiconductor chip 6 and substrate 2. Defect levels of the electronic package are therefore greatly reduced. Failure of the physical connection between substrate 2 and device 6 can also lead to subsequent failure of the electrical coupling 12 either during reflow/rework processing or upon subsequent operational thermal cycling. Since the physical connection between substrate 2 and semiconductor chip 6 remains intact when using the contractible solder of this invention, the tendency for a crack between dielectric 14 and either the substrate or the semiconductor chip is substantially eliminated. After reflow processing is complete and electronic package 10 is cooled to a temperature below the melting point of solder member 12, the solder member returns to its original shape and form as shown in FIG. 1. The intact and adhered substantially cured dielectric material 14 can now provide full mechanical support to solder member 12 during operational thermal cycling. The support between substantially cured dielectric material 14 and solder member 12 reduces the stress in the solder member preventing stress related failure to the electrical coupling between substrate 2 and semiconductor chip 6. Fatigue life of solder member 12 is increased. Furthermore, the absence of any delaminations between dielectric material 14 and the surface of substrate 2 or the dielectric material and the surface of flip chip 6 will insure that there are no cracks initiated which could propagate along these surfaces and eventually fracture solder member 12 during operational thermal cycling. Reliability of the electronic package throughout operational field life is therefore greatly improved.

We claim:

1. An electrical connection comprising:
    a first conductor;
    a second conductor; and
    a volume of solder used to form said electrical connection between said first conductor, said solder being comprised of a metal selected from the group consisting of tin, bismuth, antimony, gallium, and alloys thereof; and said second conductor wherein said volume of solder is contractible during melting thereof at a volume contraction of less than about 3%.

2. The electrical connection of claim 1, wherein said bismuth metal comprises from about 40 weight percent to about 98 weight percent of said solder.

3. The electrical connection of claim 1 further including an organic encapsulating material positioned between said first and second conductors.

4. The electrical connection of claim 3 wherein said organic encapsulating material engages said solder during contraction.

5. The electrical connection of claim 3 wherein said organic encapsulating material completely surrounds said solder during contraction.

6. The electrical connection of claim 3 wherein said organic encapsulating material includes a filler.

7. An electrical package consisting:
    a substrate;
    a device mounted on said substrate;
    at least one solder member electrically coupling said device to said substrate; and
    a dielectric material positioned substantially around said at least one solder member wherein said at least one solder member is comprised of a metal selected from the group consisting of tin, bismuth, antimony, gallium, and alloys thereof, and forming a physical connection between said substrate and said device, the volume of said at least one solder member contracting during melting of said solder by a volume contraction of less than about 3%.

8. The electronic package of claim 7 wherein said substrate is comprised of a material selected form the group consisting of ceramics, epoxy resins, filled epoxy resins, liquid crystal polymers, thermoplastics, filled thermoplastics, polyimides, and polyesters.

9. The electronic package of claim 7 wherein said device comprises a semiconductor chip, an optoelectronics assembly, or a chip carrier.

10. The electronic package of claim 7 wherein said bismuth metal comprises from about 40 weight percent to about 98 weight percent of said solder member.

11. The electronic package of claim 7 wherein said dielectric material comprises an organic encapsulating material.

12. The electronic package of claim 11 wherein said organic encapsulating material includes a filler.

13. The electronic package of claim 11 wherein said organic encapsulating materal engages said at least one solder member during contraction.

14. The electronic package of claim 11 wherein said organic encapsulating material completely surrounds said at least one solder member during contraction.

15. An electronic package comprising:
    a substrate;
    a device mounted on said substrate;
    at least one solder member electrically coupling said device to said substrate, said at least one solder member being comprised of a metal selected from the group consisting of tin, bismuth, antimony, gallium, and alloys thereof; and
    a dielectric material positioned substantially around said at least one solder member and forming a physical connection between said substrate and said device, the volume of said at least one solder member contracting during melting thereof with a volume contraction of less than about 3% to prevent failure of said physical connection and/or said electrical coupling between said substrate and said device.

16. The electronic package of claim 15, wherein said bismuth metal comprises from abut 40 weight percent to about 98 weight percent of said solder member.

17. The electronic package of claim 15 wherein said dielectric material comprises an organic encapsulating material.

18. The electronic package of claim 17 wherein said organic encapsulating material engages said at least one solder member during contraction.

19. The electronic package of claim 17 wherein said organic encapsulating material completely surrounds said at least one solder member during contraction.

20. The electronic package of claim 15 wherein said organic encapsulating material includes a filler.

* * * * *